(12) United States Patent
Lee (10) Patent No.: US 9,437,733 B2
(45) Date of Patent: Sep. 6, 2016

(54) DYNAMIC THRESHOLD MOS AND METHODS OF FORMING THE SAME

(71) Applicant: Taiwan Semiconductor Manufacturing Company, Ltd., Hsin-Chu (TW)

(72) Inventor: Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/863,909

(22) Filed: Sep. 24, 2015

(65) Prior Publication Data

US 2016/0013307 A1    Jan. 14, 2016

Related U.S. Application Data

(62) Division of application No. 14/044,665, filed on Oct. 2, 2013, now Pat. No. 9,165,926.

(51) Int. Cl.
| | | |
|---|---|---|
| *H01L 21/336* | (2006.01) | |
| *H01L 29/78* | (2006.01) | |
| *H01L 27/088* | (2006.01) | |
| *H01L 29/06* | (2006.01) | |
| *H01L 21/762* | (2006.01) | |
| *H01L 27/06* | (2006.01) | |
| *H01L 27/12* | (2006.01) | |
| *H01L 29/66* | (2006.01) | |
| *H01L 21/304* | (2006.01) | |
| *H01L 21/324* | (2006.01) | |
| *H01L 21/768* | (2006.01) | |

(52) U.S. Cl.
CPC .......... *H01L 29/783* (2013.01); *H01L 21/304* (2013.01); *H01L 21/324* (2013.01); *H01L 21/762* (2013.01); *H01L 21/76224* (2013.01); *H01L 21/76898* (2013.01); *H01L 27/0688* (2013.01); *H01L 27/088* (2013.01); *H01L 27/1203* (2013.01); *H01L 29/0653* (2013.01); *H01L 29/66477* (2013.01); *H01L 29/66651* (2013.01); *H01L 29/78* (2013.01)

(58) Field of Classification Search
USPC ................................................. 438/294, 400
See application file for complete search history.

(56) References Cited

U.S. PATENT DOCUMENTS

2013/0075743 A1    3/2013  Yoshida

*Primary Examiner* — Timor Karimy
(74) *Attorney, Agent, or Firm* — Slater Matsil, LLP (57) ABSTRACT

A chip includes a semiconductor substrate, a well region in the semiconductor substrate, and a Dynamic Threshold Metal-Oxide Semiconductor (DTMOS) transistor formed at a front side of the semiconductor substrate. The DTMOS transistor includes a gate electrode, and a source/drain region adjacent to the gate electrode. The source/drain region is disposed in the well region. A well pickup region is in the well region, and the well pickup region is at a back side of the semiconductor substrate. The well pickup region is electrically connected to the gate electrode.

20 Claims, 8 Drawing Sheets

DYNAMIC THRESHOLD MOS AND METHODS OF FORMING THE SAME

PRIORITY CLAIM AND CROSS-REFERENCE

This application is a divisional of U.S. patent application Ser. No. 14/044,665, entitled "Dynamic Threshold MOS and Methods of Forming the Same," filed on Oct. 2, 2013, which application is incorporated herein by reference.

BACKGROUND

Dynamic Threshold Metal-Oxide Semiconductor (DT-MOS) devices are generally operated by connecting the bodies of the devices to the respective gates. Making this connection causes the threshold voltage, that is, the voltage at which the device begins to conduct, to be reduced as compared to Complementary Metal-Oxide Semiconductor (CMOS) devices, which typically have threshold voltages to be about 0.6 volts or higher.

The reduction in the threshold voltage (which is actually a dynamically changing threshold voltage) allows an ultra-low power supply voltage to be used. The reduction in the power supply voltage results in a substantial reduction in the power consumption of the devices. This generally reduces battery weight, decreases the heat dissipation requirements, and may provide other advantageous features for the designer of portable electronic devices.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with a chip that includes Dynamic Threshold Metal-Oxide Semiconductor (DTMOS) devices (transistors) and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
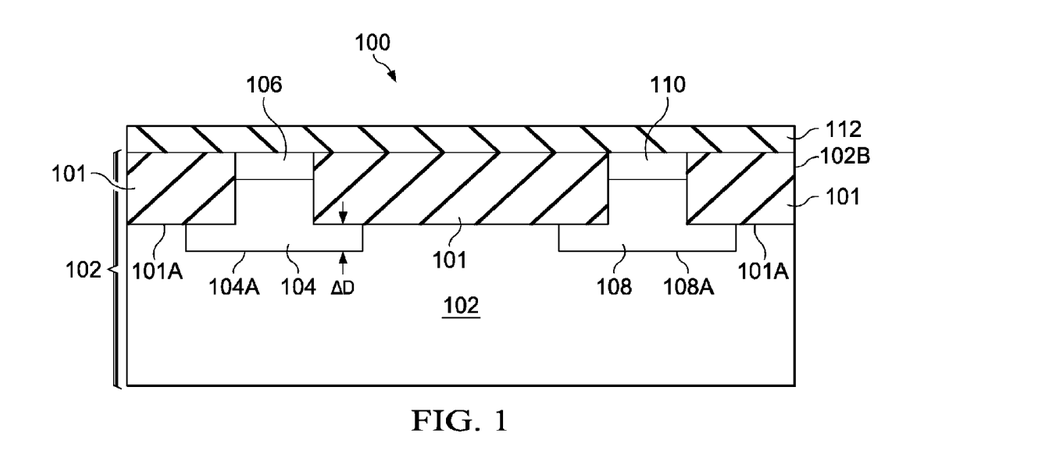
FIGS. 1 through 6 are cross-sectional views of intermediate stages in the manufacturing of a first chip/wafer in accordance with some exemplary embodiments, wherein the first chip/wafer includes Dynamic Threshold Metal-Oxide Semiconductor (DTMOS) devices therein.
Figure 9:
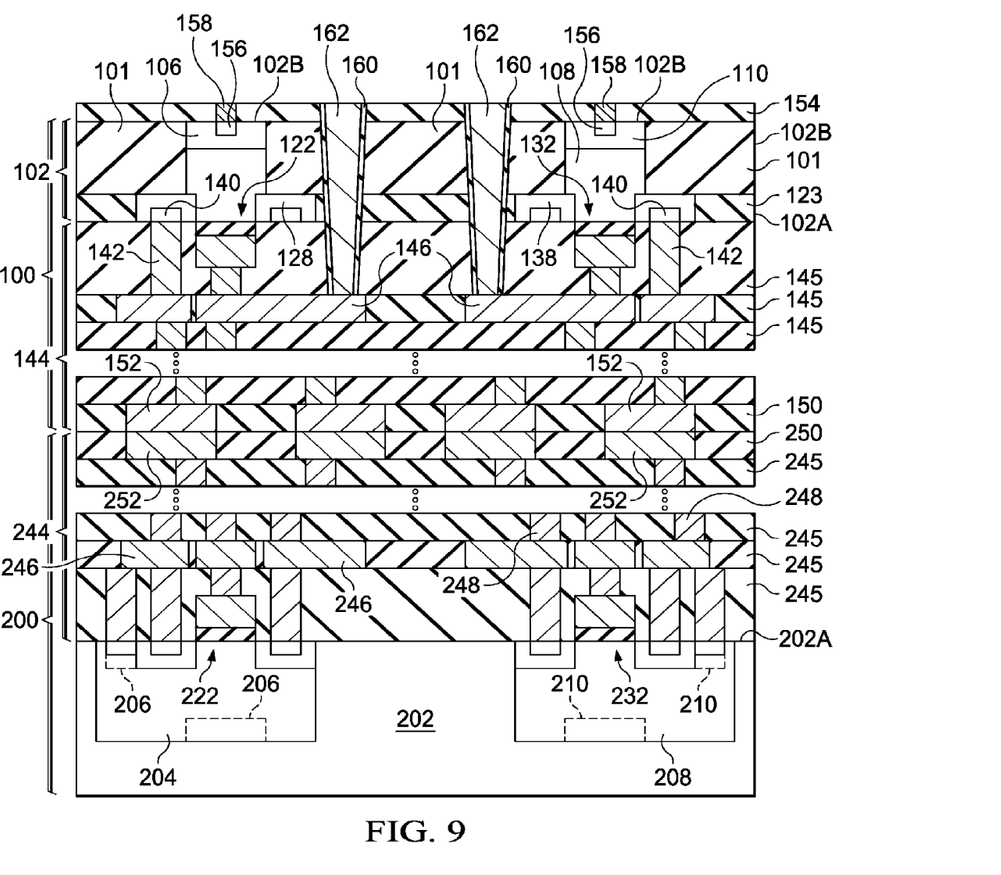
Figure 10:
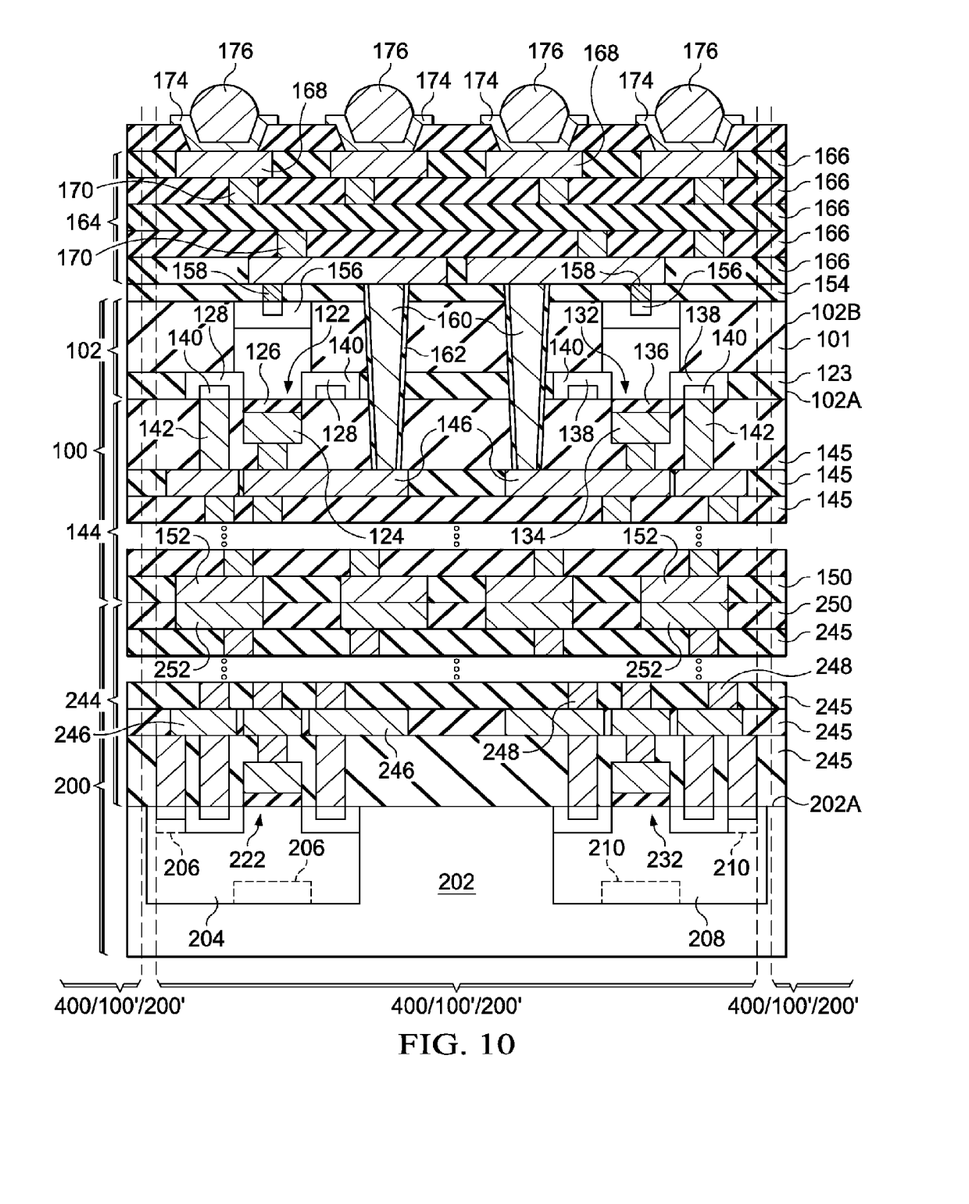
Figure 11:
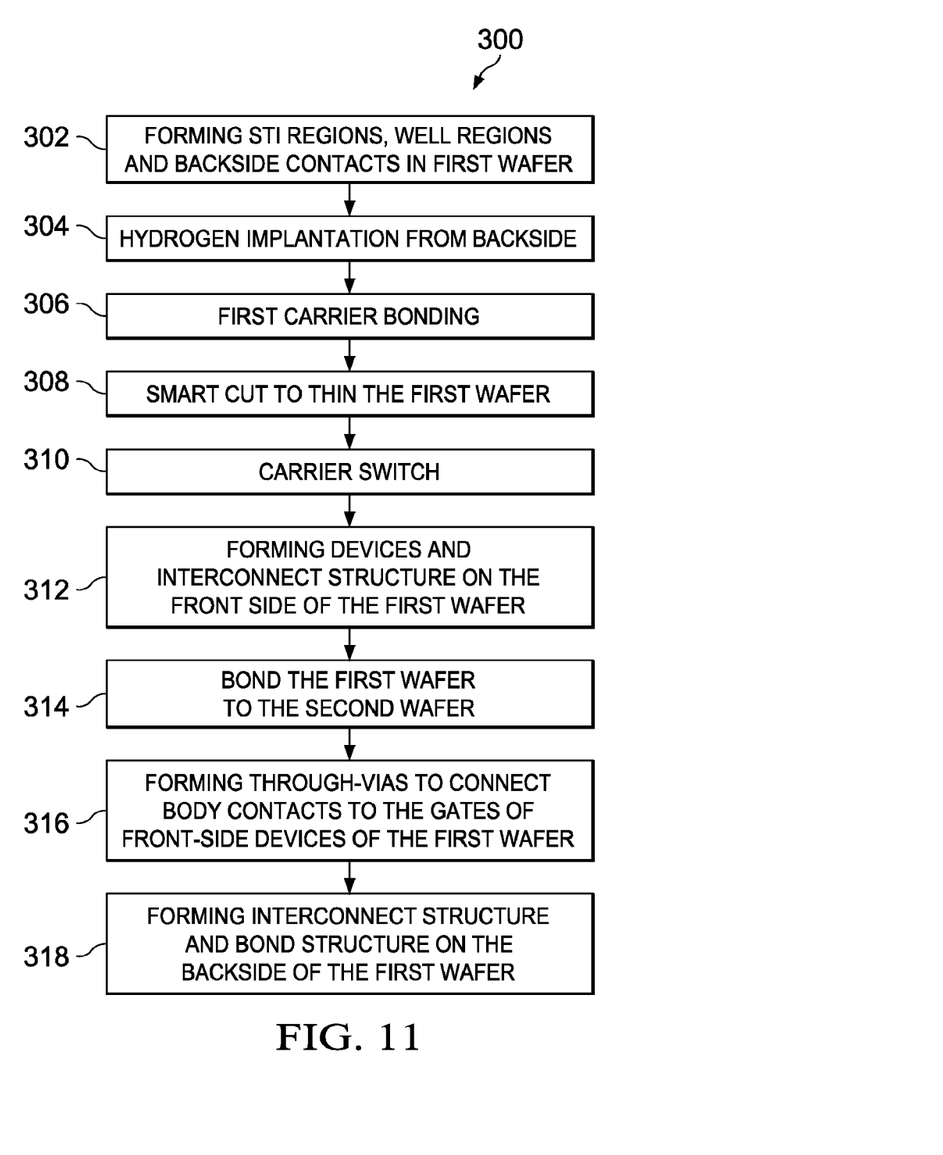
FIG. 11 illustrates a flow chart for forming a package in accordance with some embodiments.

FIG. 11 illustrates a flow chart for forming a package in accordance with some embodiments, wherein the process steps illustrated in FIGS. 1 through 10 are discussed referring to the steps shown in FIG. 11. FIGS. 1 through 6 are cross-sectional views of intermediate stages in the manufacturing of parts of a first chip in accordance with some exemplary embodiments. Referring to FIG. 1, wafer 100 is provided. Wafer 100 includes semiconductor substrate 102, which may be a silicon substrate in some embodiments. In alternative embodiments, semiconductor substrate 102 is formed of other semiconductor materials such as silicon germanium, silicon carbon, III-V compound semiconductors, or the like. Semiconductor substrate 102 is a bulk substrate that is formed of a homogeneous material, which means that the entire semiconductor substrate 102 is formed of a same semiconductor material such as silicon, silicon germanium, silicon carbon, III-V compound semiconductors, and the like.

P-well region 104 and N-well region 108 are formed in semiconductor substrate 102 (step 302 in FIG. 11). In some embodiments, P-well region 104 and N-well region 108 extend from back surface 102B to an intermediate level of semiconductor substrate 102. In some embodiments, P-well region 104 and N-well region 108 have the respective p-type and n-type impurity concentrations in the range between about $1E14/cm^3$ and $1E17/cm^3$, although higher or lower impurity concentrations may also be used. It is appreciated, however, that the values recited throughout the description are merely examples, and may be changed to different values.

Isolation regions 101 are formed in substrate 102. Isolation regions 101 may be Shallow Trench Isolation (STI) regions that extend from the back surface 102B of substrate 102 into substrate 102. STI regions 101 may comprise silicon oxide, and may be formed by etching semiconductor substrate 102 to form recesses, and then filling the recesses with a dielectric material(s). Although not shown, after the formation of STI regions 101, substrate 102 still comprises some portions, which are semiconductor materials, at a same level as the illustrated STI regions 101.

P-well pickup region 106 and N-well pickup region 110 are formed over P-well region 104 and N-well region 108, respectively (step 302 in FIG. 11), for example, through implanting the surface portions of P-well region 104 and N-well region 108, respectively. P-well pickup region 106 and N-well pickup region 110 are heavily doped regions with the respective p-type and n-type impurity concentrations higher than about $1E19/cm^3$. The impurity concentrations in the heavily doped regions 106 and 110 may also be in the range between about $1E19/cm^3$ and $1E21/cm^3$. In accordance with some embodiments, P-well pickup region 106 and N-well pickup region 110 cover some parts, but not all, of the respective P-well region 104 and N-well region 108. In alternative embodiments, as shown in FIG. 1, an entirety of one or both of P-well region 104 and N-well region 108 is covered by the respective P-well pickup region 106 and N-well pickup region 110, which means that the edges of P-well pickup region 106 and N-well pickup region 110 extend to the edges of the respective P-well region 104 and N-well region 108.

In some embodiments, the bottom surfaces 104A of P-well region 104 and bottom surface 108A of N-well region 108 are lower than bottom surfaces 101A of STI regions 101. For example, depths difference ΔD between the bottom surfaces 101A and 104A/108A may be between about 0.1 μm and about 2 μm, although different depth difference ΔD may also be adopted.

In some embodiments, sacrificial layer 112 is formed. Sacrificial layer 112 may be formed before or after the formation of regions 104, 106, 108, and 110, and is formed to reduce the damage caused by the implantations for forming regions 104, 106, 108, and 110. Sacrificial layer 112 may be a silicon oxide layer in some embodiments. The formation of sacrificial layer 112 includes, for example, a deposition using Plasma Enhanced Chemical Vapor Deposition (PECVD), Atomic Layer Deposition (ALD), or the like.

Figure 2:
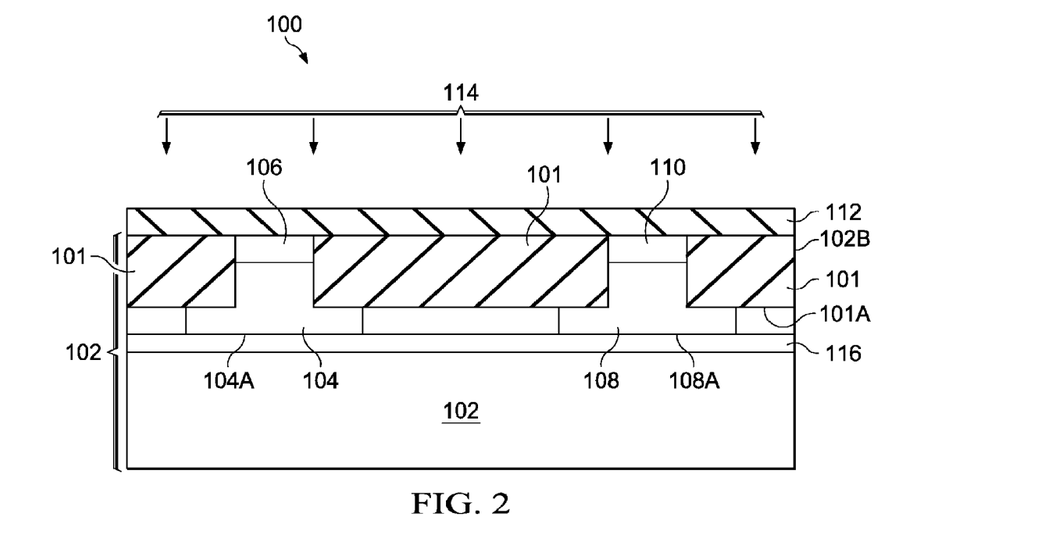

Referring to FIG. 2, hydrogen implantation 114 is performed to implant hydrogen ions into substrate 102 (step 304 in FIG. 11), so that hydrogen-concentrated layer 116 is formed in substrate 102. The implantation is performed from the backside (the side facing up in FIG. 2) of wafer 100 in some embodiments. Hydrogen-concentrated layer 116 may extend into the bottom portions, but not the top portions, of P-well region 104 and N-well region 108 in some embodiments. In alternative embodiments, the top surface of hydrogen-concentrated layer 116 is either coplanar with or lower than the bottom surfaces of P-well region 104 and N-well region 108. The top surface of hydrogen-concentrated layer 116 is also lower than the bottom surfaces of P-well pickup region 106 and N-well pickup region 110.

Figure 3:
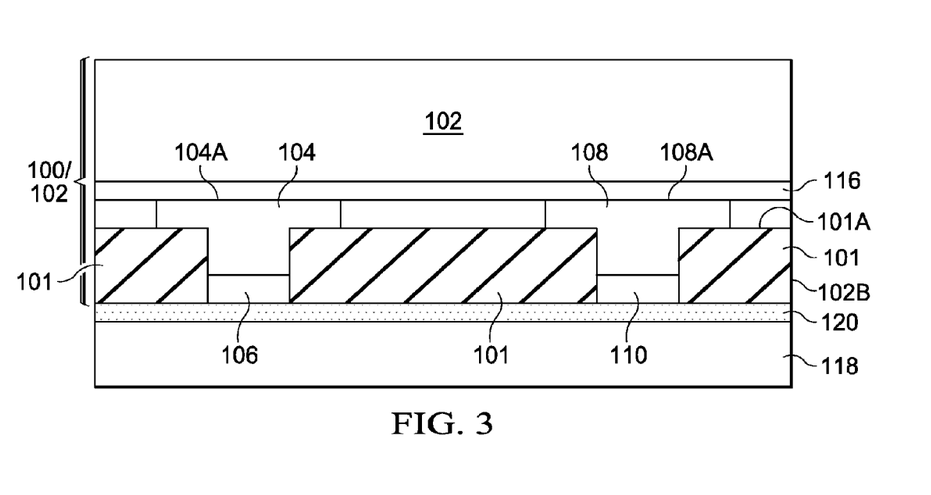
Figure 4:
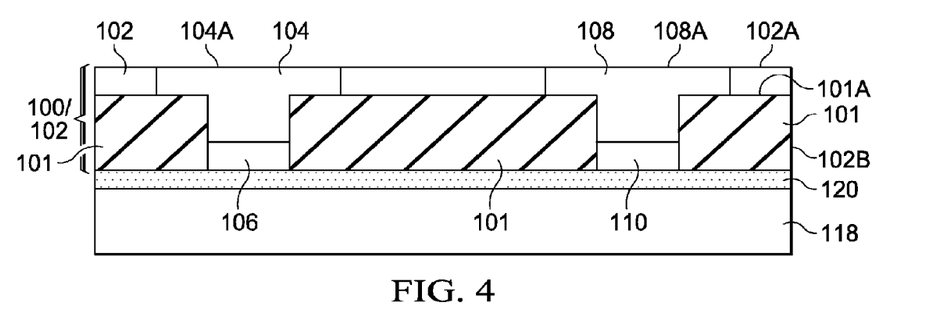

After the hydrogen implantation, sacrificial layer 112 is removed, and wafer 100 is mounted on carrier 118 (step 306 in FIG. 11), as shown in FIG. 3. The back surface 102B of substrate 102 faces toward carrier 118. Carrier 118 may be a glass carrier, a ceramic carrier, or the like. In some embodiments, wafer 100 is mounted on carrier 118 through adhesive 120, which may be an Ultra Violet (UV) glue. Next, as shown in FIG. 4, wafer 100 is cleaved to separate the portion overlying hydrogen-concentrated layer 116 and the portion underlying hydrogen-concentrated layer 116 (step 308 in FIG. 11). The respective method is sometimes referred to as a smart cut, which may include annealing wafer 100 at an elevated temperature such as about 350° C. to about 450° C., and/or applying sideway mechanical forces in the directions parallel to the top surface of wafer 100. After the smart cut, a planarization such as a Chemical Mechanical Polish (CMP) is performed to remove remaining hydrogen-concentrated layer 116, and to level front surface 102A of substrate 102. After the planarization, P-well region 104 and N-well region 108 are exposed.

Figure 5A:
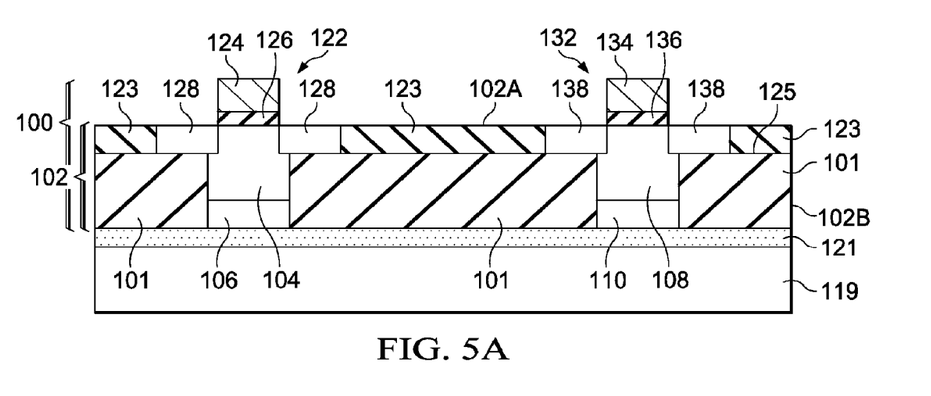

Next, referring to FIG. 5A, a carrier switch is performed (step 310 in FIG. 11), wherein the structure in FIG. 4 is mounted onto carrier 119, for example, through adhesive 121. Carrier 118 and adhesive 120 (FIG. 4) are demounted. In subsequent steps, integrated circuit devices, which may include transistors, diodes (not shown), resistors (not shown), or the like, are formed. FIG. 5A schematically illustrates the formation of n-type Metal Oxide Semiconductor (nMOS) transistor 122 and p-type MOS (pMOS) transistor 132 (step 312 in FIG. 11) in P-well region 104 and N-well region 108, respectively. In some embodiments, nMOS transistor 122 includes gate electrode 124, gate dielectric 126, and source and drain regions 128, which are heavily doped n-type regions. PMOS transistor 132 includes gate electrode 134, gate dielectric 136, and source and drain regions 138, which are heavily doped p-type regions. Source/drain regions 128 and 138 may have n-type and p-type impurity concentrations in the range between about $1E19/cm^3$ and $1E21/cm^3$. Throughout the description, the side 102A of substrate 102, at which side the integrated circuit devices 122/132 are formed, is referred to as the front surface of substrate 102 and the front surface of wafer 100, and the opposite surface 102B is referred to as a back surface of substrate 102 and the back surface of wafer 100.

Figure 5B:
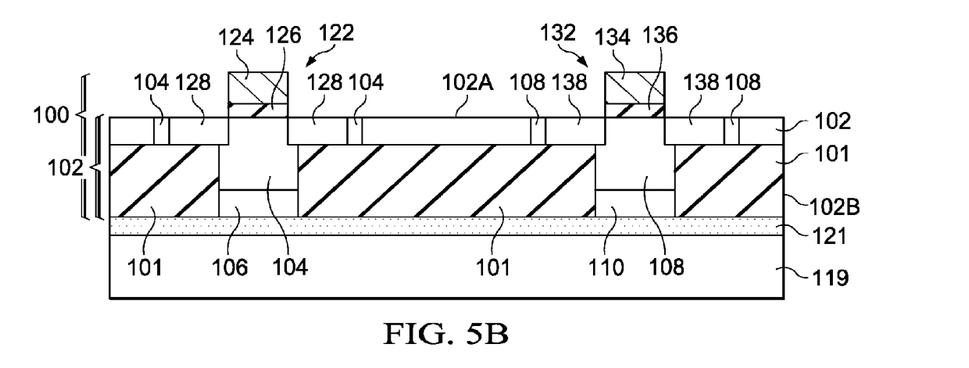

In some embodiments, as illustrated in FIG. 5A, STI regions 123 are formed in semiconductor substrate 102, wherein STI regions 123 extend from front surface 102A of substrate 102 into substrate 102. Although not shown, substrate 102 comprises portions at a same level as the illustrated isolations 123. Hence, isolation regions 101 and 123 both extend into substrate 102. For example, isolation regions 101 extend from the front surface 102A of substrate 102 to an intermediate level of substrate 102, while isolation regions 123 extend from the back surface 102B of substrate 102 to the intermediate level of substrate 102. In some embodiments, STI regions 123 have their bottom surfaces in contact with STI regions 101. Since STI regions 101 and STI regions 123 are formed in different processes, there may be distinguishable interfaces 125 between STI regions 101 and STI regions 123. In alternative embodiments, the STI regions 123 as shown in FIG. 5A are not formed. The respective structure is shown in FIG. 5B. In which embodiments, P-well region 104 have some portions remaining to be on the left side and right side of, and underlying, source and drain regions 128, and N-well region 108 have some portions remaining to be on the left side and right side of, and underlying, source and drain regions 138.

Figure 6:
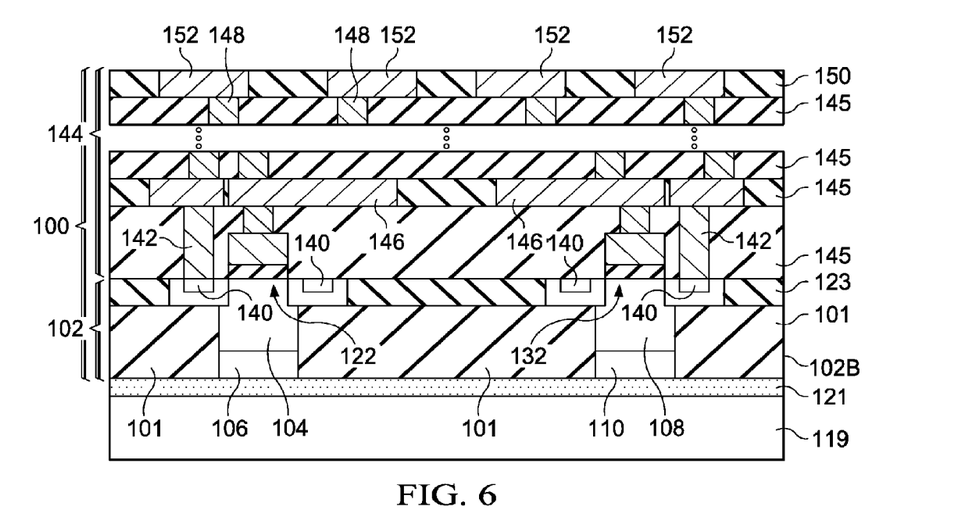

Referring to FIG. 6, source/drain silicide regions 140 are formed at the top surfaces of source/drain regions 128 and 138, and source/drain contact plugs 142 are formed over and in contact with source/drain silicide regions 140. The source/drain contact plugs that are connected to some of the illustrated source/drain silicide regions 140 are not illustrated, although they are still formed. Furthermore, interconnect structure 144 is formed (step 312 in FIG. 11). Interconnect structure 144 includes dielectric layers 145, and metal lines 146 and vias 148 formed in dielectric layers 145. Dielectric layers 145 may include an Inter-Layer Dielectric (ILD), Inter-Metal Dielectric (IMD) layers, passivation layers, and the like. The ILD layer and the IMD layers may be low-k dielectric layers in some embodiments, which have dielectric constants (k values) lower than about 3.5, lower than about 3.0, or lower than about 2.5. Dielectric layers 145 may also include non-low-k dielectric materials having dielectric constants (k values) equal to or greater than 3.8. Metal lines 146 and vias 148 may include copper, aluminum, nickel, tungsten, or alloys thereof. Metal lines 146 and vias 148 interconnect the integrated circuit devices such as transistors 122 and 132, and may electrically couple the integrated circuit devices to the overlying metal features 152.

In some embodiments, interconnect structure 144 includes surface dielectric layer 150, which is formed at the surface of wafer 100. Surface dielectric layer 150 may be a silicon-containing dielectric layer, which may comprise silicon oxide ($SiO_2$), silicon oxynitride (SiON), silicon nitride (SiN), or the like. Metal pads 152 are formed in surface dielectric layer 150, and may be electrically coupled to devices 122/132 through metal lines 146 and vias 148. Metal pads 152 may also be formed of copper, aluminum, or alloys thereof. The top surface of surface dielectric layer 150 and the top surfaces of metal pads 152 may be substantially coplanar with each other.

Figure 7:
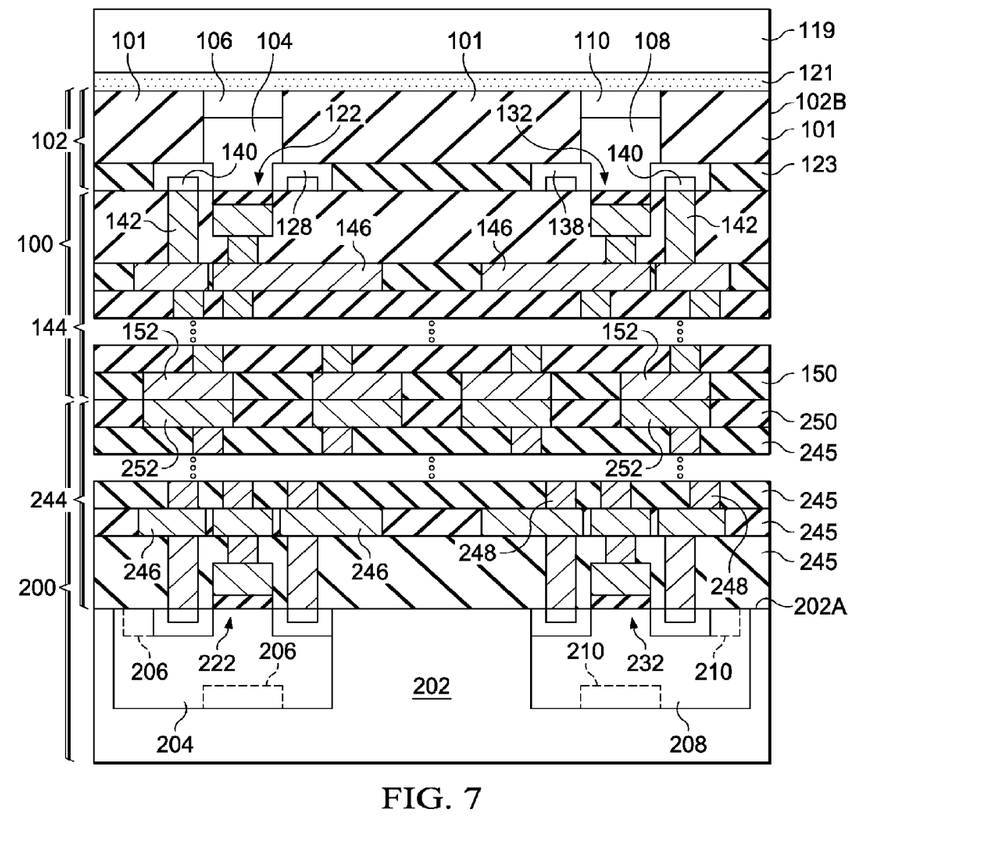
FIGS. 7 through 10 are cross-sectional views of intermediate stages in the bonding of the first chip/wafer to a second chip/wafer and the continued formation of the first chip/wafer in accordance with some exemplary embodiments.

FIG. 7 illustrates the bonding of wafer 100 to wafer 200 (step 314 in FIG. 11). Wafer 200 may be selected from a device wafer, an interposer wafer, and the like. In the illustrated FIG. 7, wafer 200 includes substrate 202, P-well region 204, N-well region 208, P-well pickup region 206, N-well pickup region 210, active devices 222/232, dielectric layers 245, metal lines 246 and vias 248 in dielectric layers 245, surface dielectric layer 250, and metal pads 252. Wafer 200 may have a structure similar to what is described for wafer 100, and the details are not repeated herein. The materials of the features in wafer 200 may be found referring to the like features in wafer 100. The features in wafer 200 are marked with reference numerals starting with number "2," which features correspond to the like features in wafer 100 and having similar reference numerals starting with number "1."

In some embodiments, P-well pickup region 206 and N-well pickup region 210 are formed at the front surface 202A of substrate 202. In alternative embodiments, P-well pickup region 206 and N-well pickup region 210 are formed at the bottom surfaces of well pickup region 206 and N-well pickup region 210, respectively. In which embodiments, further process steps may be performed to electrically couple to P-well pickup region 206 and N-well pickup region 210 from the backside (the bottom side in FIG. 7) of wafer 200.

Figure 8:
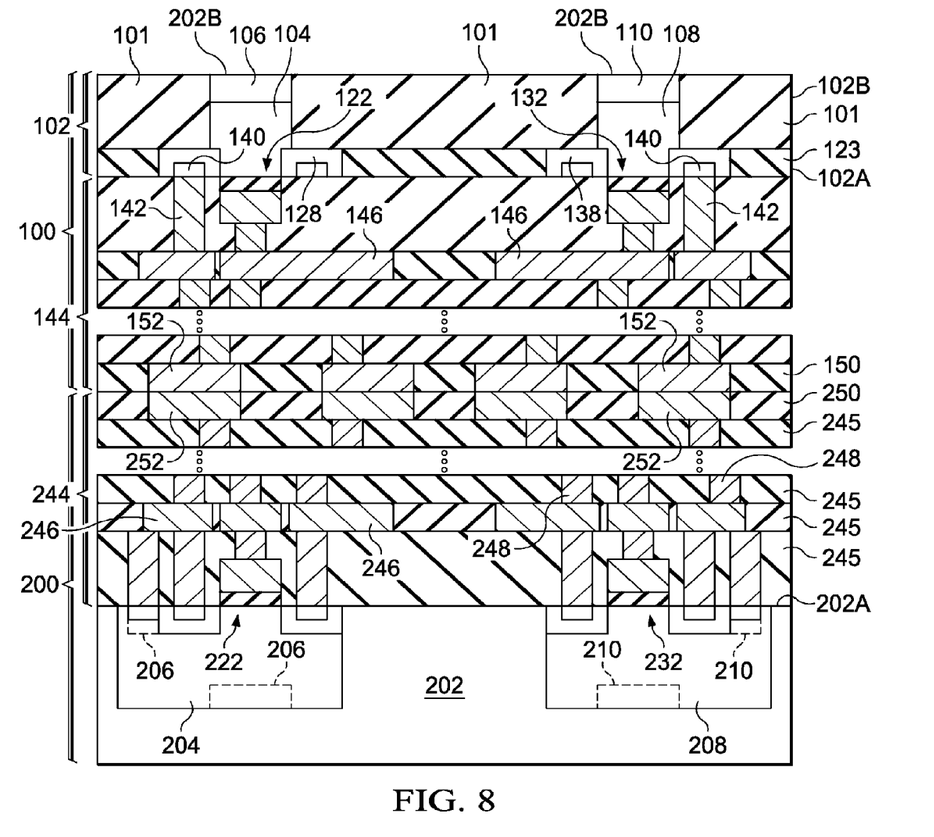

Carrier 119 and glue 121 are then removed, and the respective structure is shown in FIG. 8. Back surface 102B of substrate 102 is exposed. P-well pickup region 106 and N-well pickup region 110 are also exposed. Next, as shown in FIG. 9, dielectric layer 154 is formed over and contacting the back surface 102B of substrate 102. Body silicide regions 156 may be formed at the top surfaces of P-well pickup region 106 and N-well pickup region 110. Body contact plugs 158 are formed in dielectric layer 154 to connect to body silicide regions 156. Throughout the description, each of well pickup region 106 and N-well pickup region 110 is referred to as a backside contact structure. The backside contact structure may also include the respective overlying silicide regions 156 and contact plugs 158.

In addition, Inter-Layer Vias (ILVs) 162 are formed to electrically connect to metal line/pads 146 on the front side of substrate 102 (step 316 in FIG. 11). Throughout the description, ILVs 162 are also referred to as through-vias. In some embodiments, for example, when the embodiments in FIG. 5B are adopted, and ILVs 162 penetrate through the remaining portions of semiconductor substrate 102, isolation layer 160 is formed to encircle ILVs 162, and to physically contact both semiconductor substrate 102 and the respective ILVs 162, so that ILVs 162 are physically separated, and electrically disconnected, from substrate 102. The formation process may include etching dielectric layer 154, substrate 102, and dielectric layer 145 to form openings, filling an isolation layer in the openings, and removing the bottom portion of the isolation layer in the openings to expose metal lines/pads 146. A metallic material is then filled into the openings, followed by a CMP. The remaining portions of the isolation layer and the metallic material in the openings form isolation layers 160 and ILVs 162, respectively. In alternative embodiments, isolation layers 160 are not formed, and ILVs 162 penetrate through, and in physical contact with, STI regions 101 and 123.

FIG. 10 illustrates the formation of interconnect structure 164 on the backside of substrate 102 (step 318 in FIG. 11). Interconnect structure 164 may include dielectric layers 166, and metal lines 168 and vias 170 in dielectric layers 166. Dielectric layers 166 may include low-k dielectric layers, passivation layers, and the like. The low-k dielectric layers may have dielectric constants (k values) lower than about 3.5, lower than about 3.0, or lower than about 2.5. Dielectric layers 166 may also include non-low-k dielectric materials having dielectric constants (k values) equal to or greater than 3.8. Metal lines 168 and vias 170 may include copper, aluminum, nickel, tungsten, or alloys thereof. Through contact plugs 142, ILVs 162, and metal lines 168, gate electrodes 124 and 134 are electrically connected to the respective backside body contacts 106/110/156/158, so that the backside body contacts may have same voltage levels as the respective gate electrodes.

In some embodiments, Under-Bump Metallurgies (UBMs) 174 are formed, and electrical connectors 176 are formed on UBMs 174. Electrical connectors 176 may include solder balls, copper bumps, or the like. Electrical connectors 176 may be electrically connected to the integrated circuit devices (such as 122/132) in wafer 100 and the integrated circuit devices 222/232 in wafer 200, for example, through ILVs 162.

As shown in FIG. 10, P-well region 104, which is the body region of nMOS transistor 122, is electrically connected to gate electrode 124 of nMOS transistor 122 through p-well pickup region 106, silicide region 156, contact plug 158, metal line 168, ILV 162, and metal line 146. Accordingly, the body region and the gate electrode of nMOS transistor 122 are tied together to have the same voltage during operation. NMOS transistor 122 is thus an n-type DTMOS. Similarly, the body region and the gate electrode of pMOS transistor 132 are tied together to have the same voltage during operation. PMOS transistor 132 is thus a p-type DTMOS.

After the formation of the bonded wafers 100 and 200, a die-saw may be performed, and wafer 100 and 200 are sawed into a plurality of packages 400, each including one of chips 100' in wafer 100, and one of chips 200' in wafer 200. Packages 400 may then be bonded to other package components such as interposers, package substrates, printed circuit boards, or the like.

The embodiments of the present disclosure have several advantageous features. The source and drain regions of the DTMOS devices have minimized parasitic capacitance with surrounding regions. For example, as shown in FIG. 10, the illustrated top surfaces of the source and drain regions of the DTMOS devices are in contact with STI regions rather than well regions. Accordingly, these parts of the junction capacitance as occurring in conventional DTMOS devices are eliminated. The P-well regions may be fully isolated from N-well regions by STI regions, and hence the junction capacitance of the well regions is also eliminated. In addition, since the body contacts of the well regions are formed on the backsides of the substrates, the body contacts can overlap the respective devices such as transistors. Accordingly, the body contacts do not take extra chip area, and hence the chip area usage is improved.

In accordance with some embodiments, a chip includes a semiconductor substrate, a well region in the semiconductor substrate, and a DTMOS transistor formed at a front side of the semiconductor substrate. The DTMOS transistor includes a gate electrode, and a source/drain region adjacent to the gate electrode. The source/drain region is disposed in the well region. A well pickup region is in the well region, and the well pickup region is at a back side of the semiconductor substrate. The well pickup region is electrically connected to the gate electrode.

In accordance with other embodiments, an integrated circuit structure includes a semiconductor substrate, a well region extending from a front surface of the semiconductor substrate to a back surface of the semiconductor substrate, and a well pickup region in the well region, with the well pickup region extending from the back surface of the semiconductor substrate into the semiconductor substrate. The well pickup region and the well region are of a first conductivity type. A silicide region contacts a surface of the well pickup region. A DTMOS transistor is formed at a front side of the semiconductor substrate, wherein the DTMOS transistor comprises a gate electrode. Metallic features connect the silicide region to the gate electrode.

In accordance with yet other embodiments, a method includes forming a well region extending from a back surface of a semiconductor substrate into the semiconductor substrate, forming a well pickup region extending from the back surface of the semiconductor substrate into the well region, and forming a transistor at a front surface of the well region. The front surface of the well region is comprised in a front surface of the semiconductor substrate. Metallic features are formed to electrically interconnecting the gate electrode of the transistor and the well pickup region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   implanting a semiconductor substrate to form a well region extending from a back surface of the semiconductor substrate into the semiconductor substrate;
   forming a well pickup region extending from the back surface of the semiconductor substrate into the well region;
   forming a transistor at a front surface of the well region, wherein the forming the transistor comprises forming a gate electrode; and
   forming metallic features electrically interconnecting the gate electrode and the well pickup region.

2. The method of claim 1 further comprising:
   forming first isolation regions extending from the back surface of the semiconductor substrate into the semiconductor substrate; and
   forming second isolation regions extending from the front surface of the semiconductor substrate to the first isolation regions.

3. The method of claim 1 further comprising:
   before the forming the transistor, cleaving and planarizing the semiconductor substrate to expose the front surface of the well region.

4. The method of claim 3 further comprising implanting hydrogen ions from a backside of the semiconductor substrate to form a hydrogen-concentrated layer in the semiconductor substrate, wherein the cleaving is performed along the hydrogen-concentrated layer to separate the semiconductor substrate into a first portion and a second portion, wherein the well region is located in the first portion.

5. The method of claim 1 further comprising, after the forming the transistor:
   forming a first interconnect structure on a front side of the semiconductor substrate;
   bonding a wafer to the first interconnect structure; and
   forming a second interconnect structure on a backside of the semiconductor substrate.

6. The method of claim 5 further comprising forming a through-via penetrating through the semiconductor substrate, wherein the through-via is a part of the metallic features that is electrically coupled to the gate electrode.

7. The method of claim 1, wherein the well region and the well pickup region have a same conductivity type, and an impurity concentration of the well pickup region is higher than an impurity concentration of the well region.

8. A method comprising:
   forming first isolation regions extending from a back surface of a semiconductor substrate into the semiconductor substrate;
   cleaving a front portion of the semiconductor substrate to separate the front portion apart from a remaining portion of the semiconductor substrate, wherein a front surface of the front portion of the semiconductor substrate is exposed;
   forming second isolation regions extending from the front surface of the semiconductor substrate to the first isolation regions; and
   forming a transistor at the front surface of the semiconductor substrate.

9. The method of claim 8, wherein the cleaving comprising:
   implanting the semiconductor substrate to form a hydrogen-concentrated layer; and
   annealing the semiconductor substrate and simultaneously applying a sideway mechanical force on the semiconductor substrate, wherein portions of the semiconductor substrate on opposite sides of the hydrogen-concentrated layer are separated from each other.

10. The method of claim 8 further comprising forming metallic features electrically interconnecting a gate electrode of the transistor and a well pickup region of a well region in the semiconductor substrate.

11. The method of claim 8 further comprising forming a well region extending from the back surface of the semiconductor substrate into the semiconductor substrate, wherein after the cleaving, the well region is exposed.

12. The method of claim 11 further comprising forming a well pickup region extending from the back surface of the semiconductor substrate into the well region.

13. The method of claim 8 further comprising forming a through-via penetrating through the semiconductor substrate.

14. The method of claim 13, wherein the through-via further penetrates through one of the first isolation regions and one of the second isolation regions.

15. A method comprising:
   forming first isolation regions extending from a back surface of a semiconductor substrate into the semiconductor substrate;
   forming a well region extending from the back surface of the semiconductor substrate into the semiconductor substrate;
   forming a well pickup region extending from the back surface of the semiconductor substrate into the well region;

implanting the semiconductor substrate to form a hydrogen-concentrated layer, wherein the hydrogen-concentrated layer is spaced apart from the first isolation regions;

annealing the semiconductor substrate and simultaneously applying a sideway mechanical force on the semiconductor substrate to remove a portion of the semiconductor substrate, with a front surface of the semiconductor substrate exposed; and forming second isolation regions extending from the front surface of the semiconductor substrate to the first isolation regions.

16. The method of claim 15 further comprising forming a transistor at a front surface of the well region, wherein the front surface of the well region is a part of the front surface of the semiconductor substrate.

17. The method of claim 16, wherein the front surface of the semiconductor substrate is spaced apart from the first isolation regions by a layer of the semiconductor substrate, and the forming the transistor further comprises forming a source/drain region in the layer of the semiconductor substrate.

18. The method of claim 15 further comprising, after the annealing, planarizing the front surface of the semiconductor substrate.

19. The method of claim 15 further comprising forming a through-via penetrating through the semiconductor substrate.

20. The method of claim 19, wherein the through-via further penetrates through one of the first isolation regions.

* * * * *